United States Patent [19]
Bevk et al.

[11] Patent Number: 5,500,391
[45] Date of Patent: Mar. 19, 1996

[54] METHOD FOR MAKING A SEMICONDUCTOR DEVICE INCLUDING DIFFUSION CONTROL

[75] Inventors: Joze Bevk, Summit; Leonard C. Feldman, Berkeley Heights; Hans-Joachim L. Gossmann, Summit, all of N.J.; Henry S. Luftman, Emmaus, Pa.; Ran-Hong Yan, Holmdel, N.J.

[73] Assignee: AT&T Corp., Murray Hill, N.J.

[21] Appl. No.: 287,989

[22] Filed: Aug. 9, 1994

[51] Int. Cl.⁶ .................................................. H01L 29/161
[52] U.S. Cl. .......................... 437/131; 437/106; 437/987; 437/40
[58] Field of Search ..................... 437/131, 987, 437/106, 126, 234, 40, 41, 29; 257/18–20; 148/DIG. 15

[56] References Cited

U.S. PATENT DOCUMENTS

| | | |
|---|---|---|
| 4,728,619 | 3/1988 | Pfiester et al. |
| 4,861,393 | 8/1989 | Bean et al. ............................ 148/33.4 |
| 4,994,866 | 2/1991 | Awano .................................... 357/16 |
| 5,019,882 | 5/1991 | Solomon et al. ....................... 357/16 |
| 5,256,550 | 10/1993 | Laderman et al. ..................... 437/106 |
| 5,268,324 | 12/1993 | Aitken et al. .......................... 437/57 |
| 5,323,020 | 6/1994 | Mohammad et al. .................. 257/17 |
| 5,338,942 | 8/1994 | Nishida et al. ......................... 257/17 |
| 5,354,700 | 10/1994 | Huang et al. ........................... 437/40 |
| 5,357,119 | 10/1994 | Wang et al. ............................. 257/18 |

OTHER PUBLICATIONS

"Boron Diffusion in Strained $Si_{1-x}Ge_x$ Epitaxial Layers," N. Moriya et al., *Physical Review Letters*, vol. 71, No. 6, Aug. 9, 1993, pp. 883–886.

"Measurement and Modeling of Boron Diffusion in Si and Strained $Si_{1-x}Ge_x$ Epitaxial Layers During Rapid Thermal Annealing," G. H. Loechelt et al., *J. Appl. Phys.*, 74(9), Nov. 1, 1993, pp. 5520–5526.

*Primary Examiner*—George Fourson
*Assistant Examiner*—S. Mulpuri
*Attorney, Agent, or Firm*—M. I. Finston; R. D. Slusky

[57] ABSTRACT

A process for making a MOS device on a silicon substrate includes the step of forming a buried layer of germanium-silicon alloy in the substrate, or, alternatively, a buried layer of silicon enclosed between thin, germanium-rich layers. This buried layer is doped with boron, and tends to confine the boron during annealing and oxidation steps. The process includes a step of exposing the substrate to an oxidizing atmosphere such that an oxide layer 10 Å–500 Å thick is grown on the substrate.

5 Claims, 4 Drawing Sheets

METHOD FOR MAKING A SEMICONDUCTOR DEVICE INCLUDING DIFFUSION CONTROL

FIELD OF THE INVENTION

This invention relates to processes for manufacturing MOS devices. More particularly, this invention relates to the control of boron diffusion during the manufacture of MOS devices that include boron-doped regions.

ART BACKGROUND

Boron has long been used as a dopant for semiconductor devices. However, boron atoms tend to diffuse during the annealing and oxidation steps of a fabrication sequence. As a result, it is difficult to manufacture devices, such as deep sub-micron NMOS and CMOS device, in which the boron distribution must have a steep profile.

It has long been known that the presence of germanium as a co-dopant will retard the diffusion of boron. For example, U.S. Pat. No. 4,728,619, issued to J. R. Pfiester et al. on Mar. 1, 1988, describes a method for making a CMOS integrated circuit having boron-doped channel-stop regions. Germanium is implanted into these regions to retard the diffusion of boron. The germanium is implanted at a concentration of less than 1 at. %. After the germanium is implanted, a field oxide more than 6000 Å thick is grown.

We believe that the method of Pfiester for providing germanium-doped regions will only be of limited value for making deep sub-micron devices. In order to make boron profiles steep enough for, e.g., vertically engineered devices having buried boron-doped layers, it will be necessary to include more than 1 at. % germanium in the boron-doped regions.

We believe that in the method of Pfiester, there is, in fact, some concentration of the implanted germanium during the subsequent field oxide growth. That is, the advancing oxidation front ejects germanium atoms into the underlying silicon. However, the improvements in device performance reported by Pfiester were measured in devices having more than 6000 Å of field oxide, as noted above. In the manufacture of deep sub-micron devices, by contrast, it would generally be unacceptable to grow more than about 500 Å of oxide at any time after the boron and germanium dopants have been incorporated in the water. That is because, according to at least some generally accepted manufacturing methods, the gross structure of the devices will already have been defined by, e.g., patterning an initial field oxide layer. Subsequent growth of a further oxide layer having a thickness even as small as 500 Å could obliterate this gross structure.

What practitioners in the art have hitherto failed to provide is a method for making MOS devices having germanium-containing regions that will control boron diffusion to such an extent that sharply defined structures such as pulse-shaped or retrograde boron-doped regions are readily incorporated.

SUMMARY OF THE INVENTION

We have invented a process for making a MOS device on a silicon substrate. This device includes a germanium-containing region that can exert tight control over boron diffusion. This process includes the step of forming a pseudomorphic, strained layer of $Ge_xSi_{1-x}$ on the substrate, where the average local value of x at each depth within the strained layer is at least about 0.1, and the GeSi layer is overlain by a silicon layer. The process includes the further steps of lithographically patterning the GeSi and silicon layers such that at least one active region is collectively defined in them; doping the GeSi layer with boron at a concentration of at least about $10^{17}$ cm$^{-3}$ but not more than about $10^{19}$ cm$^{-3}$; maintaining the patterned and boron-doped substrate at a temperature of at least about 750° C. and not more than about 950° C.; and while maintaining the substrate at this elevated temperature, exposing the substrate to an oxidizing atmosphere such that an oxide layer at least about 10 Å thick, but not more than about 500 Å thick, is grown on the silicon layer. The purpose of this oxidation step is to induce boron to diffuse into the SiGe and the oxide layers, resulting in a sharper boron profile and reduced boron concentration in the channel region. The gate dielectric layer in the active device need not be formed by thermal oxidation.

DETAILED DESCRIPTION

We now describe an illustrative fabrication process useful, inter alia, for making an MOS device having a pulse-shaped boron doping profile, or an MOS device having a retrograde boron doping profile.

Figure 1:
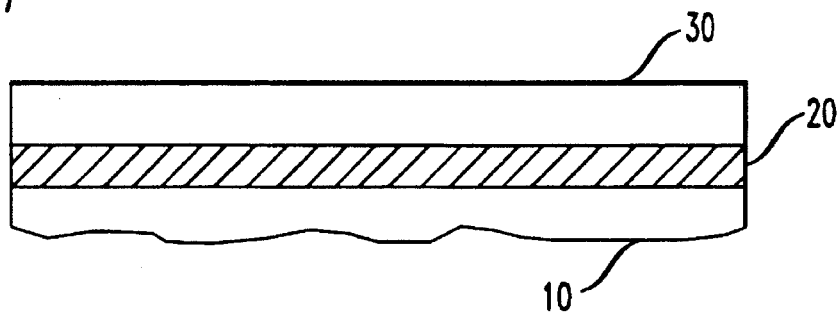
FIG. 1 is a schematic diagram of a silicon wafer containing a buried layer of silicon-germanium alloy.

Turning to FIG. 1, a silicon water 10 is provided, suitable as a substrate for MOS device fabrication. Well-known methods of molecular beam epitaxy (MBE) or chemical vapor deposition (CVD) are used to grow an epitaxial, pseudomorphic, strained layer 20 of silicon-germanium alloy having the composition $Ge_xSi_{1-x}$. Layer 30 of silicon is then grown over layer 20. The germanium mole fraction x should be at least about 0.1. At each value of x, there will be a critical thickness for dislocation growth in the strained layer. The thickness of layer 20 should be less than this critical thickness. By way of example, at x=0.20, layer 20 can be made up to 300 Å thick (or somewhat more), and will be about 200 Å thick for typical applications that we currently envisage. The corresponding thickness of layer 30 will typically be about 500 Å.

It should be noted that x need not he constant within layer 20. Instead, useful embodiments of layer 20 can be made in which x varies, exemplarily according to a triangular or parabolic distribution that is greatest at the upper and lower interfaces and least at a depth internal to the layer. Another useful embodiment of layer 20 would consist of a Si/Si$_x$Ge$_{1-x}$ superlattice, with values of x typically 0<x<0.5.

Layer 20 is to be doped with boron at a concentration in the approximate range $10^{17}$–$10^{19}$ cm$^{-3}$. According to one doping method, the boron is codeposited, together with silicon and germanium, during the growth of layer 20. According to an alternative method, the boron is incorporated by ion implantation, as discussed below. The ion implantation method is currently preferred, because by this method it is feasible to localize the distribution of (as-implanted) boron only in the areas where boron doping is desired. Thus, for example, implanted boron is readily excluded from those portions of a CMOS substrate that are intended for PMOS channel regions.

Figure 2:
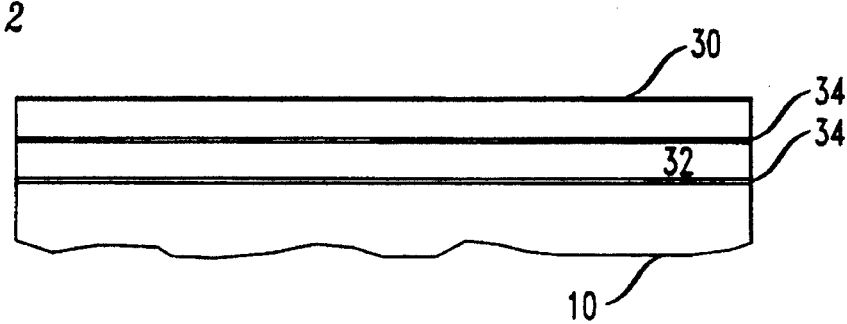
FIG. 2 is a schematic diagram of a silicon wafer containing a buried silicon layer enclosed between two thin, germanium-rich boundary layers.

As we discuss in greater detail below, alloy layer 20 is advantageously included because it tends to confine the boron dopant during subsequent annealing. We have found that an alternative structure is also useful in this regard. Such a structure is shown in FIG. 2. The alternative structure comprises a boron-doped, epitaxial, silicon layer 32 enclosed between upper and lower germanium-rich, epitaxial, boundary layers 34. Each of layers 34 will typically consist of at least 2, but fewer than 6, monolayers of substantially pure germanium. However, an admixture of silicon in these layers can also be tolerated, provided the layers are made thick enough to compensate for the presence of silicon. Thus, a boundary layer 34 will generally be useful if in thickness it is equivalent to 8 or fewer monolayers, and it has an average germanium mole fraction of at least 75%. The greatest permissible thickness, at any given germanium mole fraction, will of course be limited by the critical thickness at that composition.

Figure 3:
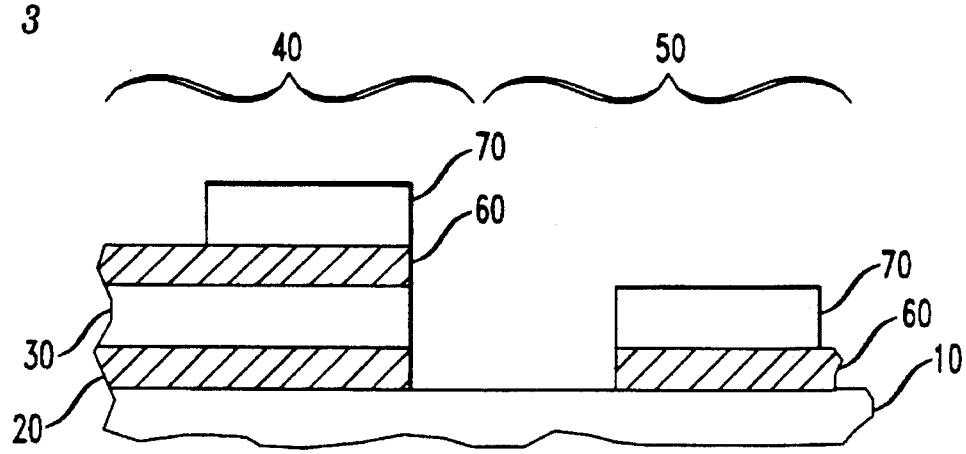
FIGS. 3–6 are schematic diagrams that illustrate, sequentially, selected steps in the fabrication of an MOS device from the substrate of FIG. 1 or FIG. 2, in accordance with the invention.

A conventional sequence of steps is now performed in order to define the NMOS active regions on the wafer. Some of these steps are described below, with reference to the accompanying figures. Turning first to FIG. 3, if CMOS circuitry is being made, the wafer is subdivided into NMOS regions 40 and PMOS regions 50. During this sequence of steps, patterned pad oxide layer 60 and patterned nitride layer 70 are formed.

Figure 4:
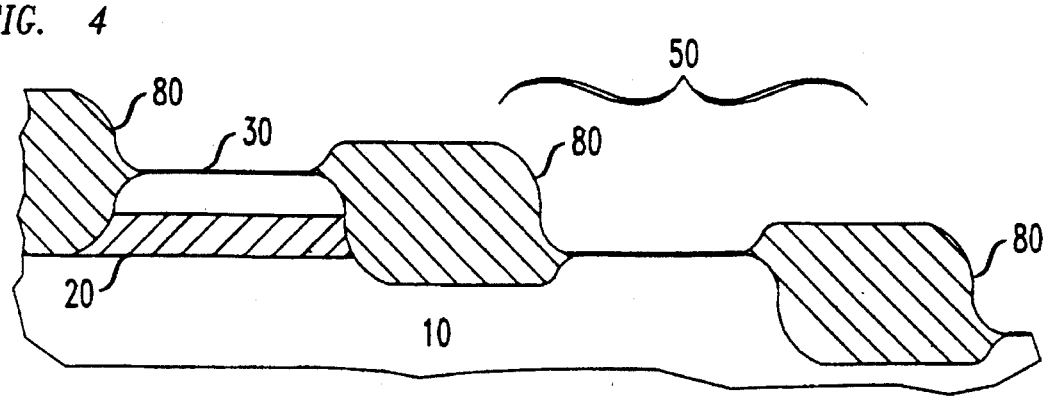

Turning next to FIG. 4, the active regions are conventionally isolated by growing thermal oxide features 80, and nitride layer 70 is removed.

Figure 5:
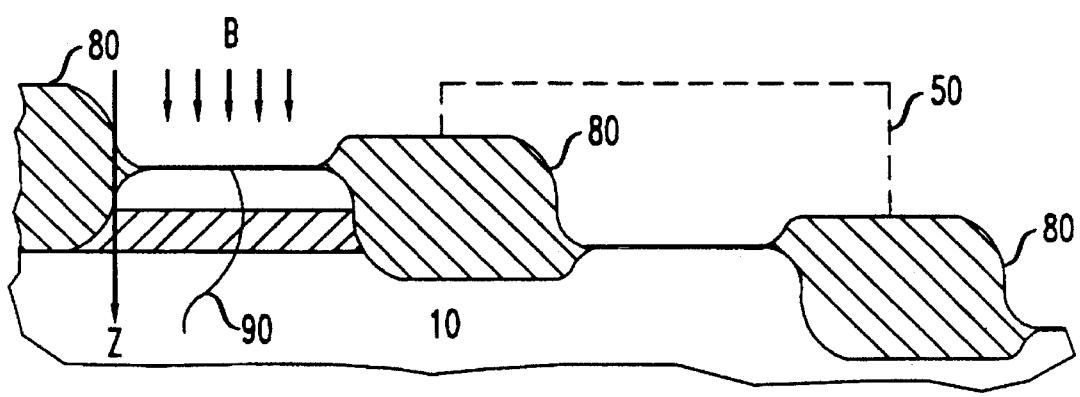

If layer 20 is to be doped by boron implantation, this implantation is next performed. As shown in FIG. 5, the implantation will lead to an as-implanted boron profile 90 that is relatively high throughout layers 20 and 30, and falls off with increasing depth z into the substrate. Typical conditions for the implantation of boron in the form of boron difluoride (BF$_2$) are: energy of 90 keV and areal dose of $10^{13}$ cm$^{-2}$. (We currently prefer to implant boron difluoride because we find that it yields a sharper dopant profile than atomic boron.) If CMOS circuitry is being made, the intermediate processes leading to formation of the PMOS channels are also performed at this stage in the fabrication sequence.

The as-implanted, or as-deposited, boron profile is then modified by maintaining the substrate at a temperature in the approximate range 750° C.–950° C. At temperatures above this range, layer 20 may experience thermally-induced damage. At temperatures below this range, the desired modification of the boron profiles will not take place within a reasonable amount of time. During at least a portion of this annealing step, an oxide layer at least about 10 Å thick, but not more than about 500 Å thick, is grown on layer 30. This oxide step allows boron profile to be adjusted according to the device requirements. The oxide layer is then etched away and a gate oxide is either thermally grown or deposited by established techniques.

Figure 6:
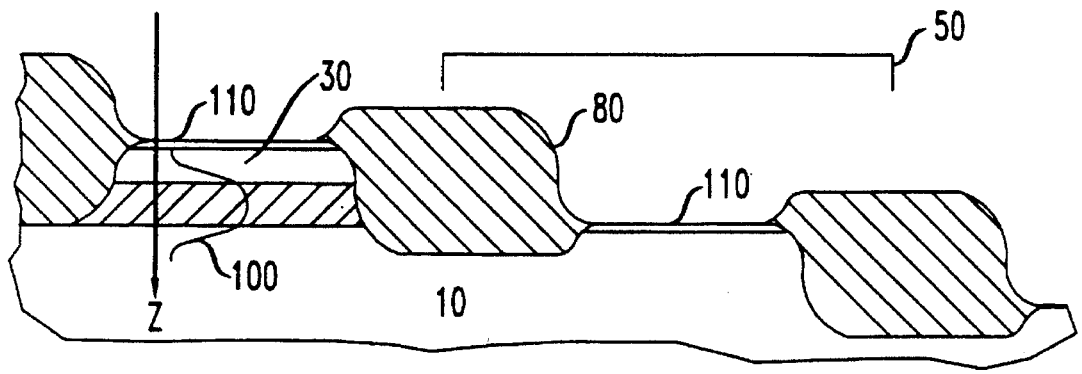

We have found that layer 20 tends to inhibit the diffusive broadening of the boron profile that would otherwise occur during the annealing step. As a consequence, boron profile 100 after annealing remains strongly confined in the neighborhood of layer 20, as shown in FIG. 6. We have further found that if oxidation takes place during the annealing step, boron atoms will preferentially diffuse from silicon layer 30 into the newly formed oxide. This provides a further method for enhancing the confinement of boron within layer 20. That is, a sacrificial oxide layer 110 is readily grown during the annealing step, but removed before the actual gate dielectric layer is either grown or deposited. By permitting boron to diffuse into the sacrificial oxide layer 110 and then removing that layer, the surface and near-surface concentrations of boron are further reduced.

The use of a sacrificial layer to remove boron is particularly useful if the boron has been introduced by ion implantation. This is because it is simpler, and therefore advantageous, to introduce the boron by a shallow implant, rather than an implant designed to produce a peak boron concentration at a predetermined depth. However, the shallow implant will result in an as-implanted boron concentration that has an approximately constant, maximum value throughout layers 20 and 30. The preferential diffusion of boron into the sacrificial oxide helps to sharpen the initially flat profile within layer 30.

Figure 7:
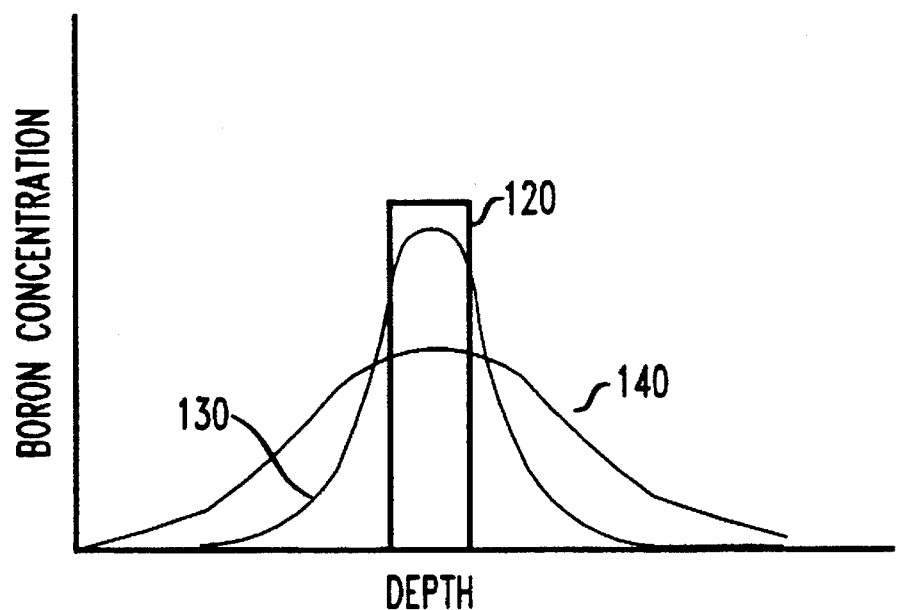
FIG. 7 is a schematic representation of idealized concentration profiles of co-deposited boron before and after annealing a water processed according to the invention, and a corresponding profile after annealing a water processed according to prior-art methods in which the boron-doped layer is otherwise pure silicon.
Figure 8:
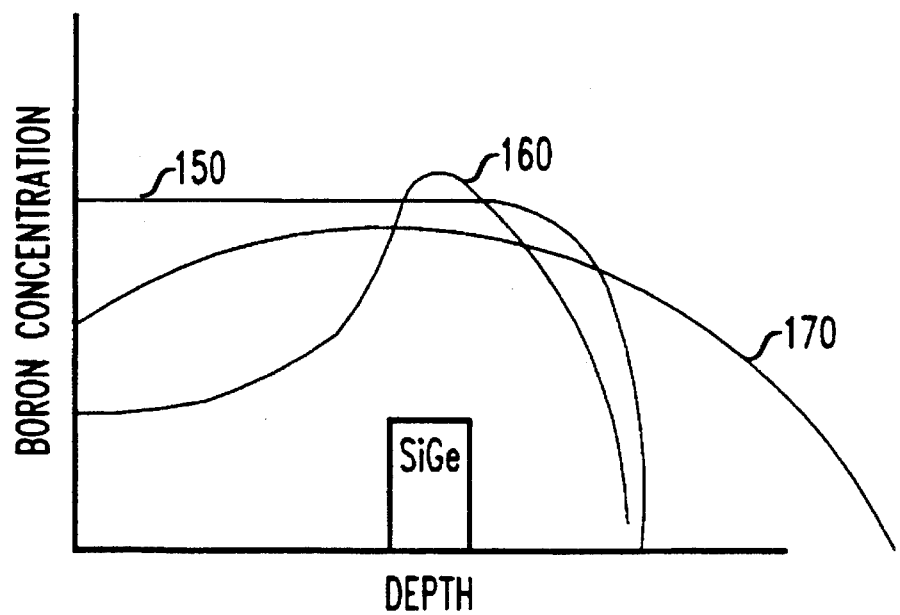
FIG. 8 is similar to FIG. 7, except that the boron is implanted, rather than co-deposited.

Compared in FIG. 7 is a group of idealized concentration profiles: profile 120 of co-deposited boron before annealing, the resulting profile 130 after annealing, and profile 140 corresponding to profile 130 in the case where the boron-doped layer is otherwise pure silicon. Compared in FIG. 8 is a further group of idealized concentration profiles: profile 150 of implanted boron before annealing, the resulting profile 160 after annealing, and profile 170 corresponding to profile 160 in the case where the boron-doped layer is otherwise pure silicon. The profiles of FIGS. 7 and 8 are presented purely as a pedagogical aid, and are not intended to represent accurate theoretical or experimental results. According to our current belief, the annealing and oxidizing conditions are readily adjusted to make actual profiles, corresponding to profiles 130 and 160, in which the logarithmic boron concentration falls quite steeply (in the direction leading out of layer 20) within a region at least 100 Å thick near each boundary of layer 20. We believe that an average slope can be achieved in these regions that is greater than one decade per 500 Å.

According to our current belief, a decrease in the surface boron concentration (i.e., between layer 30 and the gate dielectric layer, which is not shown in the figure) in heterostructures incorporating Si-Ge alloy layers primarily reflects the drop at the interface between layers 20 and 30. This drop is primarily due to lower chemical potential and, to a lesser extent, due to lower diffusivity of boron in strained (pseudomorphic) SiGe. For those devices where low boron surface concentration (i.e., less than about $10^{16}$ cm$^{-3}$) is needed, and therefore a very high germanium concentration would be required, the thermal and mechanical stability of the alloy layer would have to be carefully considered. In order to achieve desired doped-pulse widths in such devices without exceeding the alloy layer critical thickness, it might be desirable to adopt a germanium profile that has a parabolic, or other similar functional dependence, on the depth. This would reduce the average germanium concentration, while maintaining the necessary high concentration at the interfaces. In such heterostructures, the initial boron profile would also have to be adjusted to compensate for the dopant redistribution during oxidation and annealing. If necessary, the precise shape needed for the initial germanium and boron profiles could be readily determined through experimentation.

EXAMPLE

We obtained a 5-cm in diameter Si(100) wafer doped with boron to a resistivity of 30 ohm-cm. We cleaned this water by a chemical means and sublimated the remaining oxide, yielding a protective, carbon-free oxide that was subsequently desorbed at about 850° C. in a molecular beam epitaxy (MBE) growth chamber (base pressure less than $2 \times 10^{-11}$ torr). We then deposited a 3000 Å epilayer of pure silicon at a substrate temperature of 600° C.–700° C. We then deposited in succession, by MBE, a Si-25 at. % Ge layer 250 Å thick, and a silicon cap layer 400 Å thick. The growth temperatures were 500° C. for the Si-Ge layer, and 600° C. for the cap layer.

We implanted $BF_2$ in the finished water at a dose of $10^{13}$ $cm^{-2}$ and an energy of 90 keV, and cleaned the implanted wafer by standard techniques. One half of the wafer was then reserved as a control sample. We oxidized the other half of the wafer in dry oxygen at 800° C. for 18 minutes, and then annealed it for 20 minutes in dry nitrogen at 800° C.

Figure 9:
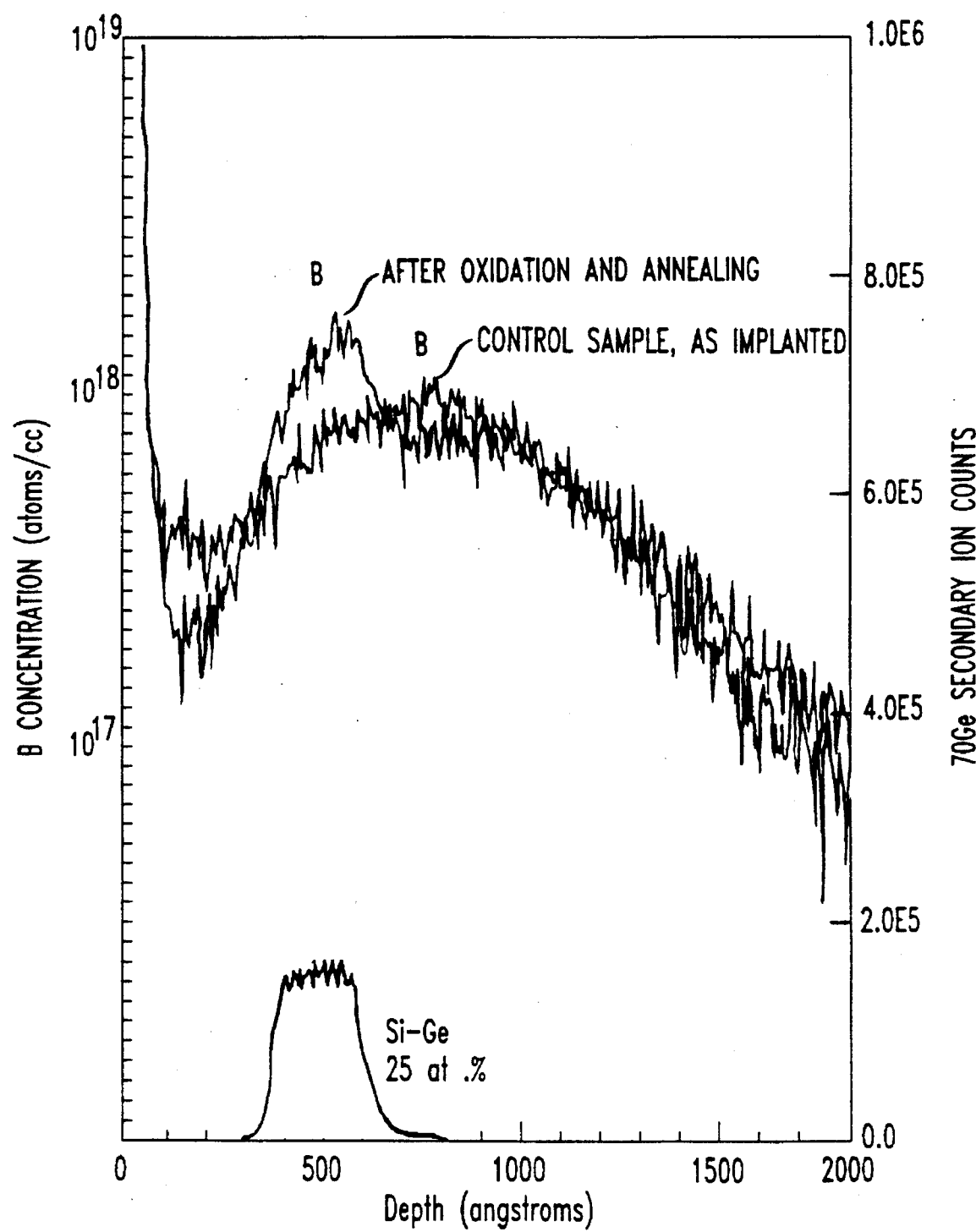
FIG. 9 is a graph of experimentally measured boron concentration profiles directly after boron implantation, and after subsequent oxidation and annealing.

SIMS profiles of the control sample and the processed sample are shown in FIG. 9. It is apparent from the figure that the processed sample exhibits substantially greater boron confinement and lower boron concentration at the interface.

We claim:

1. A process for making a MOS device on a silicon substrate, comprising the steps of:
    a) forming sequentially on the substrate a lower boundary layer, a pulse-doped layer that substantially comprises silicon, an upper boundary layer, and a silicon channel layer, wherein each of the upper and lower boundary layers comprises germanium in a mole fraction of at least about 75%, the thickness of each boundary layer is eight or fewer monolayers, and the thickness of each boundary layer is no more than the critical thickness for silicon-germanium epitaxial layers containing said germanium mole fraction;
    b) lithographically patterning the pulse-doped layer and the silicon channel layer such that at least one active region is collectively defined in them;
    c) during (a) or after (b), doping the pulse-doped layer with boron at a concentration of at least about $10^{17}$ $cm^{-3}$ but not more than about $10^{19}$ $cm^{-3}$;
    d) after (b) and (c), heating the substrate to at least about 750° C. but not more than about 950° C.; and
    e) during at least a portion of the heating step, exposing the substrate to an oxidizing atmosphere such that an oxide layer at least about 10 Å thick, but not more than about 500 Å thick, is grown on the silicon channel layer, wherein the doping, heating, and exposing steps are carded out such that near each of said boundary layers, there is a region at least 100 Å thick in which the boron concentration decreases, in the direction leading away from the pulse-doped layer, at an average logarithmic rate greater than 1 decade per 500 Å.

2. The method of claim 1, further comprising the steps of:
    growing a sacrificial oxide layer on the silicon channel layer such that a portion of any boron ions that may be present in the silicon channel layer will diffuse into the sacrificial oxide layer; and
    removing the sacrificial oxide layer.

3. A process for making a MOS device on a substrate having a principal surface that substantially comprises silicon, the process comprising:
    a) growing on said surface a pseudomorphic, strained layer of germanium-silicon alloy, such that at any given depth within said layer, the layer has an average germanium mole fraction of at least about 0.1;
    b) epitaxially growing a channel layer over said strained layer, said channel layer substantially comprising silicon;
    c) lithographically patterning the strained layer and the channel layer, thereby to define at least one active region in said layers;
    d) implanting in the strained layer a dopant that comprises boron, thereby to dope the strained layer at a boron concentration of at least about $10^{17}$ $cm^{-3}$, but not more than about $10^{19}$ $cm^{-3}$;
    e) after the patterning and implanting steps, heating the substrate to at least about 750° C. but not more than about 950° C.; and
    f) during the heating step, exposing the substrate to an oxidizing atmosphere such that an oxide layer at least about 10 Å thick, but not more than about 500 Å thick, is grown on the silicon channel layer, wherein the heating and exposing steps are carried out such that boron introduced into the channel layer by the implanting step is reduced in concentration within said channel layer.

4. The process of claim 3, Wherein the strained layer has upper and lower boundaries, and the heating and exposing steps are carded out such that near each of said boundaries, there is a region at least 100 Å thick in which the boron concentration decreases, in the direction leading out of the strained layer, at an average logarithmic rate greater than 1 decade per 500 Å.

5. The process of claim 3, further comprising the steps of:
    growing a sacrificial oxide layer on the silicon channel layer such that a portion of any boron ions that may be present in the silicon channel layer will diffuse into the sacrificial oxide layer; and
    removing the sacrificial oxide layer.

* * * * *